United States Patent
Do et al.

(10) Patent No.: US 7,667,308 B2
(45) Date of Patent: Feb. 23, 2010

(54) LEADED STACKED PACKAGES HAVING INTEGRATED UPPER LEAD

(75) Inventors: Byung Tai Do, Singapore (SG); Francis Heap Hoe Kuan, Singapore (SG); Seng Guan Chow, Singapore (SG)

(73) Assignee: STATS ChipPAC, Ltd., Singapore (SG)

( * ) Notice: Subject to any disclaimer, the term of this patent is extended or adjusted under 35 U.S.C. 154(b) by 556 days.

(21) Appl. No.: 11/459,568

(22) Filed: Jul. 24, 2006

(65) Prior Publication Data
US 2008/0017957 A1    Jan. 24, 2008

(51) Int. Cl.
*H01L 23/495* (2006.01)
(52) U.S. Cl. ........................ 257/676; 257/686
(58) Field of Classification Search ................ 257/666, 257/686, 777, 778, 676; 438/108, 109, 123, 438/124
See application file for complete search history.

(56) References Cited

U.S. PATENT DOCUMENTS

| 7,151,013 | B2* | 12/2006 | Corisis et al. ............... 438/127 |
| 7,384,819 | B2* | 6/2008 | Yip et al. .................... 438/109 |
| 2005/0194676 | A1 | 9/2005 | Fukuda et al. |
| 2006/0102989 | A1 | 5/2006 | Lee et al. |
| 2006/0261453 | A1* | 11/2006 | Lee et al. .................... 257/676 |

* cited by examiner

*Primary Examiner*—Sheila V. Clark
(74) *Attorney, Agent, or Firm*—Robert D. Atkins (57) ABSTRACT

A semiconductor package includes a leadframe. An upper lead is disposed above the leadframe. A first die is attached to a lower surface of the upper lead to provide electrical conductivity from the first die to the upper lead. A second die is attached to the first die. A method of manufacturing a semiconductor package includes providing a leadframe having an upper lead, lower lead, and an elevated die paddle. A first die, attached to a plurality of dies in a wafer form, is attached to a second die. The first die is singulated from the plurality of dies. The first and second dies are attached to the elevated die paddle structure. The first die is wire bonded to the lower lead. An encapsulant is formed over the first and second dies. The elevated die paddle is removed to expose a surface of the upper lead and second die.

14 Claims, 8 Drawing Sheets

LEADED STACKED PACKAGES HAVING INTEGRATED UPPER LEAD

FIELD OF THE INVENTION

The present invention relates in general to semiconductor devices and, more particularly, to multi-chip semiconductor packages that have stacked dies.

BACKGROUND OF THE INVENTION

Semiconductors, or computer chips, are found in virtually every electrical product manufactured today. Chips are used not only in very sophisticated industrial and commercial electronic equipment, but also in many household and consumer items such as televisions, clothes washers and dryers, radios, and telephones. As products become smaller but more functional, there is a need to include more chips in the smaller products to perform the functionality. The reduction in size of cellular telephones is one example of how more and more capabilities are incorporated into smaller and smaller electronic products.

As the demand for semiconductor devices with low-cost, high performance, increased miniaturization, and greater packaging densities has increased, Multi-Chip Module (MCM) structures have been developed to meet the demand. MCM structures have a number of dies and other semiconductor components mounted within a single semiconductor package. The number of dies and other components can be mounted in a vertical manner, a lateral manner, or combinations thereof.

One such approach is to stack one die on top of another and then enclose the stack of dies in one package. The final package for a semiconductor with stacked dies is much smaller than would result if the dies were each packaged separately. In addition to providing a smaller size, stacked-die packages offer a number of advantages that relate to the manufacturing of the package, such as ease of handling and assembly.

In a stacked-die arrangement, the dies are wire-bonded sequentially, typically with automated wire-bonding equipment employing well-known thermal compression or ultrasonic wire-bonding techniques. During the wire-bonding process, the head of a wire-bonding apparatus applies a downward pressure on a conductive wire held in contact with a wire-bonding pad on the die to weld, or bond, the wire to the bonding pad on the die.

In many cases, stacked-die semiconductors can be fabricated faster and more cheaply than several semiconductors, each having a single die, which perform the same functions. A stacked-die approach is advantageous because of the increase in circuit density achieved.

Despite efforts to overcome problems resulting in lower yields of semiconductor packages with stacked dies, problems still exist. In particular, dies within the stack fail prematurely. Additionally, at least one die often overlies a plurality of other active or passive components, making designing of such semiconductor packages more difficult. Furthermore, the layout of bonding pads on the substrate is difficult, resulting in bonding wires of various lengths being used. The placement, as well as the parasitic inductance and parasitic capacitance of various-length bonding wires, needs to be taken into account during the design of the semiconductor package.

An upper die can crack during wire-bonding of the upper die due to lack of vertical support if the upper die overhangs the next lower die in the stack of dies. Consequently, smaller dies usually are placed on top of larger dies in semiconductor packages having stacked dies. Heat dissipation in semiconductor packages having multiple dies is a problem. The more dies that are placed in a semiconductor package, the greater the problem with heat dissipation.

The presence of multiple dies in a semiconductor package causes problems with the flow of the molding compound used to encapsulate the dies in forming the semiconductor package. There is also a problem with designing suitable electrical ground paths to the dies in a stacked-die semiconductor package.

When multiple dies are stacked in a semiconductor package, more adhesive material is used in the semiconductor package. Adhesive materials have the tendency to absorb moisture, which can have adverse effects on the dies, reducing the reliability and useful life of the semiconductor package. Furthermore, there is a thermal mismatch between the materials used to position the stacked dies in the semiconductor package and the substrate. The resulting relative motion of the dies with respect to the substrate has an adverse effect on the reliability of solder balls used to connect the dies to the substrate.

A need exists for a stacked-die arrangement which addresses the problems previously described, yet is efficient and cost-effective to manufacture. In addition, a need exists for a stacked-die arrangement which satisfies increased reliability test requirements.

SUMMARY OF THE INVENTION

In one embodiment, the present invention is a semiconductor package comprising a leadframe, an upper lead disposed above the leadframe, a first die attached to a lower surface of the upper lead to provide electrical conductivity from the first die to the upper lead, and a second die attached to the first die.

In another embodiment, the present invention is a semiconductor package comprising a leadframe, an upper lead and elevated die paddle assembly disposed above the leadframe, a first die connected a lower surface of the upper lead and elevated die paddle assembly to support the first die within the semiconductor package, and a second die connected to the first die.

In still another embodiment, the present invention is a method of manufacturing a semiconductor package comprising providing a leadframe having an upper lead, a lower lead, and a elevated die paddle, attaching a first die to a second die, the first die attached to a plurality of dies in a wafer form, singulating the first die from the plurality of dies, and attaching the first and second dies to the elevated die paddle structure, wire bonding the first die to the lower lead, forming an encapsulant over a portion of the first and second dies, and removing the elevated die paddle to expose a surface of the upper lead and second die.

BRIEF DESCRIPTION OF THE DRAWINGS

FIG. 3b illustrates a first cross-sectional view of the leadframe structure depicted in FIG. 3a;

FIG. 3c illustrates a second cross-sectional view of the leadframe structure depicted in FIG. 3a;

DETAILED DESCRIPTION OF THE DRAWINGS

The present invention is described in one or more embodiments in the following description with reference to the Figures, in which like numerals represent the same or similar elements. While the invention is described in terms of the best mode for achieving the invention's objectives, it will be appreciated by those skilled in the art that it is intended to cover alternatives, modifications, and equivalents as may be included within the spirit and scope of the invention as defined by the appended claims and their equivalents as supported by the following disclosure and drawings.

A semiconductor package can be manufactured which takes into account a stacked-die arrangement and serves to alleviate many of the problems previously described, while providing increasingly smaller sizes. The package can be manufactured more easily and with greater efficiency than previous packages, resulting in a package with lower overall manufacturing cost.

The semiconductor packages described below reduce incidences of upper die cracking during wire bonding of the upper die, which provides additional freedom in the design and location of various sized dies in semiconductor packages having stacked dies. Additionally, the packages alleviate problems associated with heat dissipation in semiconductor packages having multiple dies, which allows more dies to be placed in a given semiconductor package.

The semiconductor packages described serve to reduce the amount of adhesive material used when multiple dies are stacked, resulting in a reduction in the amount of moisture that can be absorbed into the package. Finally, the reliability of semiconductor packages having stacked dies is increased by use of the following designs and methods of manufacture.

Figure 1A:
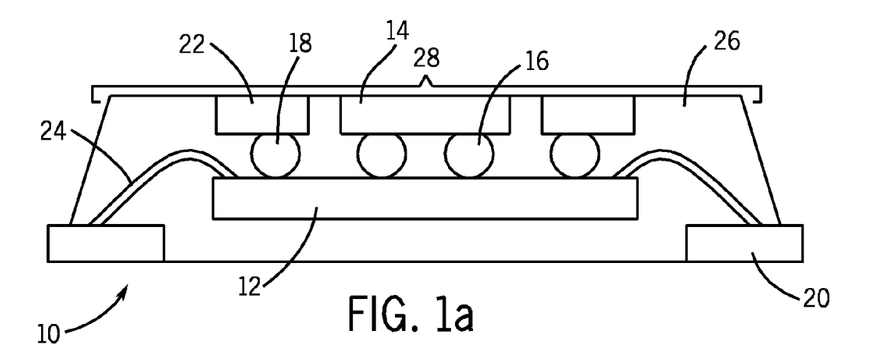
FIG. 1a illustrates an embodiment of a semiconductor package for a stacked-die arrangement.

Turning to FIG. 1a, a semiconductor package 10 with a stacked-die arrangement is illustrated. Package 10 includes a first die 12, and a second die 14 which is connected by a ball grid array (BGA) 16. Use of BGA 16 reduces upper die cracking during wire bonding partly due to the stability of the BGA. BGA 16 can be manufactured using techniques generally known in the art. Package 10 also includes a lower lead structure 20 and an upper lead structure 22. Upper lead structure 22 and lower lead 20 are integrated into a lead frame assembly as will be later described. Wire bonds 24 are seen providing electrical conductivity between die 12 and the lower lead structure 20.

An encapsulant 26 is formed over dies 12, 14 and at least a portion of lead 20 and upper leads 22 to provide structural support, resulting in the completed package 10. Wire bond 24 and encapsulant 26 can consist of a variety of materials. The manufacturing techniques involving bonds 24 and encapsulant 26 can include those generally known in the art and selected for a particular application. Die 12 is electrically connected to upper leads 22 through BGA 18. A flat surface 28 exposes a top surface of upper leads 22 and die 14 to allow further mounting of packages, as will be further described. Upper leads 22 provide for electrical conductivity to a second package or a variety of components.

As FIG. 1a demonstrates, the interconnection of package 10 to an additional top package is achieved via upper leads 22. Implementing upper leads 22 allows full encapsulation of package 10, thus hermetically sealing package 10. Hermetically-sealed package 10 can pass higher reliability test requirements.

Figure 1B:
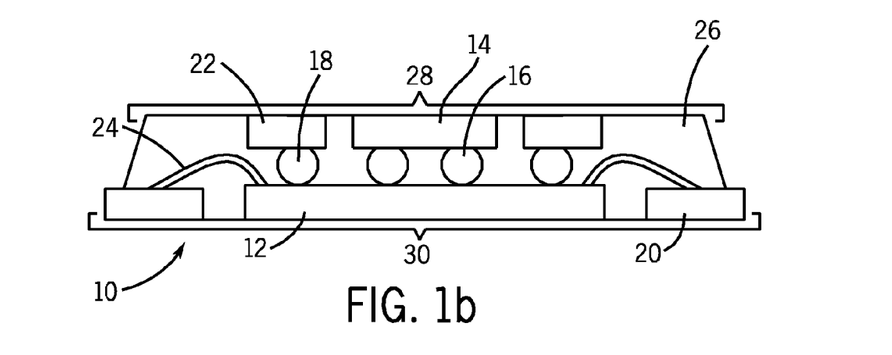
FIG. 1b illustrates an additional embodiment of a semiconductor package for a stacked-die arrangement.

FIG. 1b illustrates an additional embodiment of a semiconductor package with a stacked-die arrangement. Again, dies 12 and 14, BGAs 16,18, lower lead 20, upper leads 22, wire bond 24, and encapsulant 26 are depicted. Package 10 having encapsulant 26 is configured to expose surfaces 30 and 28 to allow dies 12 and 14 to be exposed for a particular application.

Figure 1C:
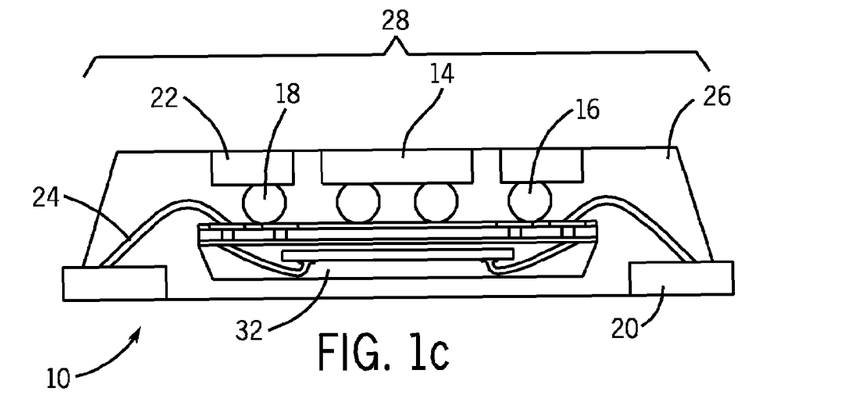
FIG. 1c illustrates an additional embodiment of a semiconductor package for a stacked-die arrangement.

FIG. 1c illustrates a package 10 having upper leads 22 where die 12 is replaced with a package 32. Package 32 can include such internal stacking modules (ISMs) as land grid arrays (LGAs) or Quad Flat Nonleaded (QFN) package structures which are generally known in the art. Again, encapsulant 26 is formed around package 32 and a portion of die 14 for structural support. Here again, package 10 is hermetically sealed, allowing electrical conductivity from package 32 through BGA 18 to an exposed top surface 28 of upper leads 22. Package 32 becomes fully encapsulated and is protected by encapsulant 26, which enhances reliability of package 32 as mounted to die 14.

Figure 1D:
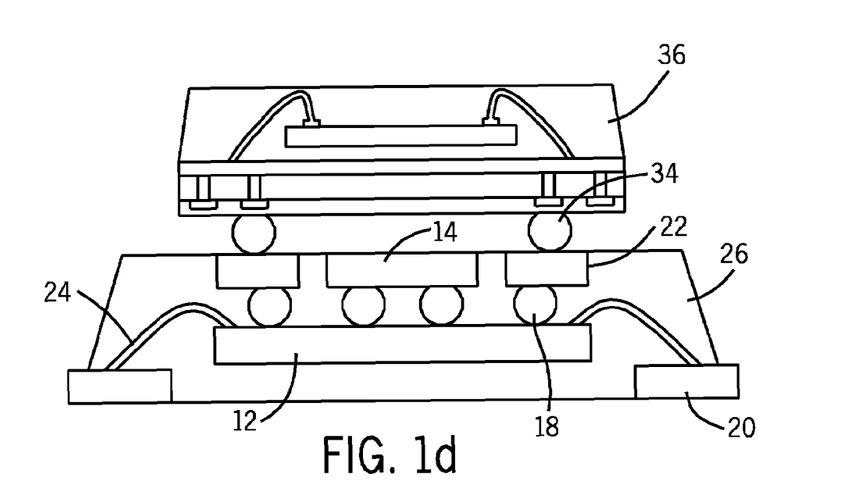
FIG. 1d illustrates an additional embodiment of a semiconductor package for a stacked-die arrangement.

FIG. 1d illustrates a package 10 having a mounted package 36 in a package-on-package (PoP) arrangement using additional BGA 34. Package 36 can be a leaded package, array package, flip chip die, or passive component. Electrical conductivity is provided through BGA 18, upper leads 22, and BGA 34 to package 36 as shown.

Figure 2A:
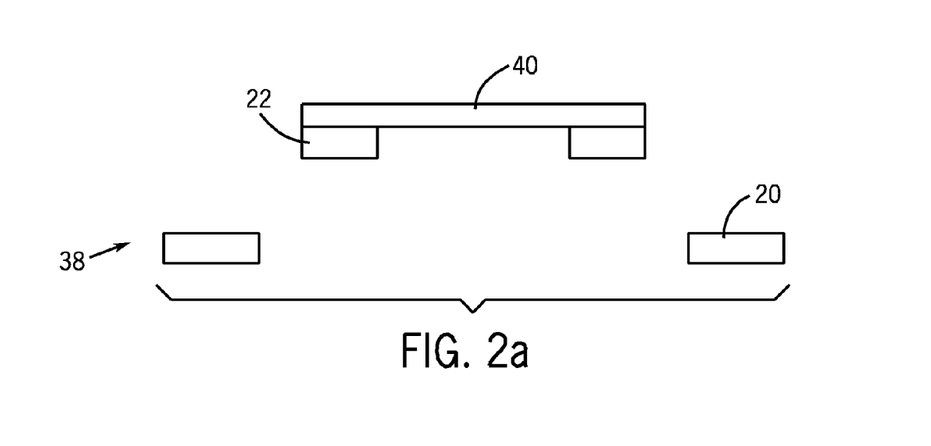
FIG. 2a illustrates a first step in a first example method of manufacturing a semiconductor package for a stacked-die arrangement.
Figure 2B:
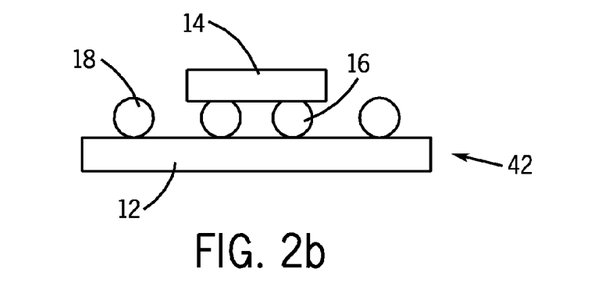
FIG. 2b illustrates a second step in a first example method of manufacturing a semiconductor package for a stacked-die arrangement.

FIG. 2a illustrates a first step in an example method of manufacturing a semiconductor package 10 for a stacked-die arrangement, the package including the just described upper leads 22. Leadframe 38 is formed, which includes a elevated die paddle 40 structure temporarily connected to upper leads 22, forming an upper lead and elevated die paddle assembly for providing structural support through the manufacturing process. As a next step, FIG. 2b illustrates connecting die 14 to die 12 using BGA 16. Additionally, BGA 18 is deposited on die 12 as shown. Die 12 is connected to die 14 using BGA 16 while die 12 exists as a plurality of dies in unsingulated wafer form. A plurality of singulated dies 14 can be connected to a plurality of dies 12 in wafer form to form a die assembly 42 as shown.

Figure 2C:
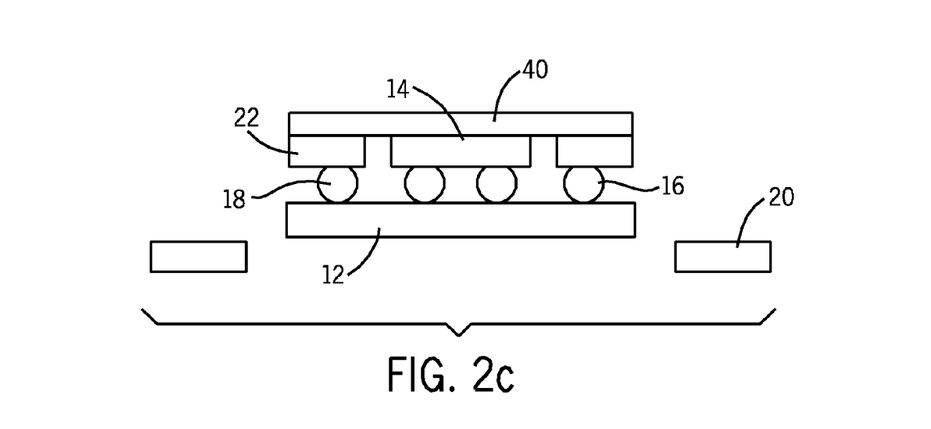
FIG. 2c illustrates a third step in a first example method of manufacturing a semiconductor package for a stacked-die arrangement.

As a next step, FIG. 2c illustrates connecting assembly 42 including upper leads 22 and second die 14 to a bottom surface of elevated die paddle 40. Again, FIG. 2c demonstrates that elevated die paddle 40 supports assembly 42 in a particular position relative to lower leads 20 during the manufacturing process In some cases, the solder balls are reflowed. However, if gold bumps are utilized, reflowing is not necessary.

Figure 2D:
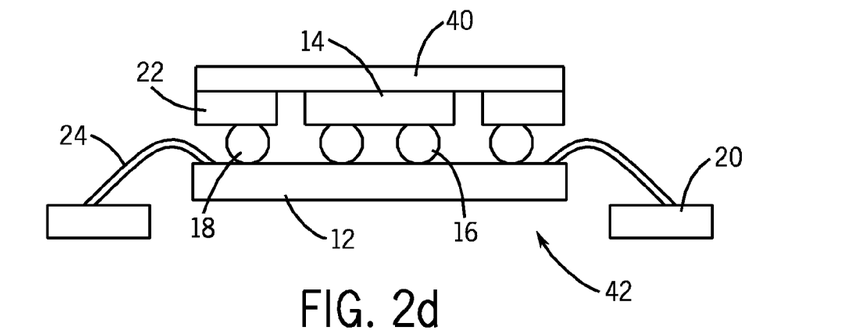
FIG. 2d illustrates a fourth step in a first example method of manufacturing a semiconductor package for a stacked-die arrangement.
Figure 2E:
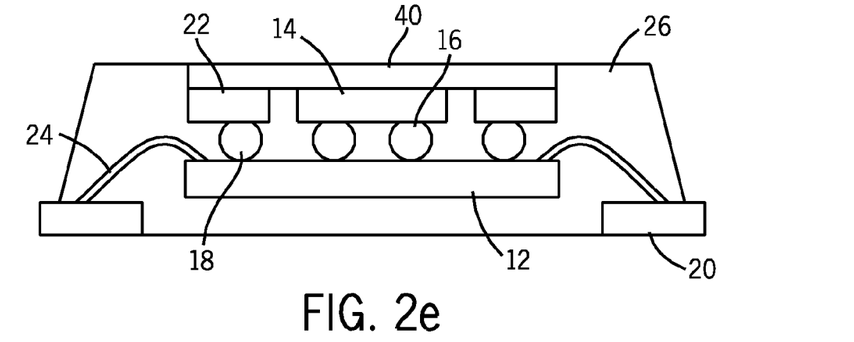
FIG. 2e illustrates a fifth step in a first example method of manufacturing a semiconductor package for a stacked-die arrangement.

FIG. 2d illustrates a next step of wire bonding the die 12 to lower leads 20, resulting in wire bonds 24. Turning to FIG. 2e, an encapsulant 26 is then formed over dies 12, 14 and a portion of elevated die paddle 40 as illustrated in FIG. 2e, which hermetically seals die 12, and the BGA 16,18 connection between dies 12 and 14.

Figure 2F:
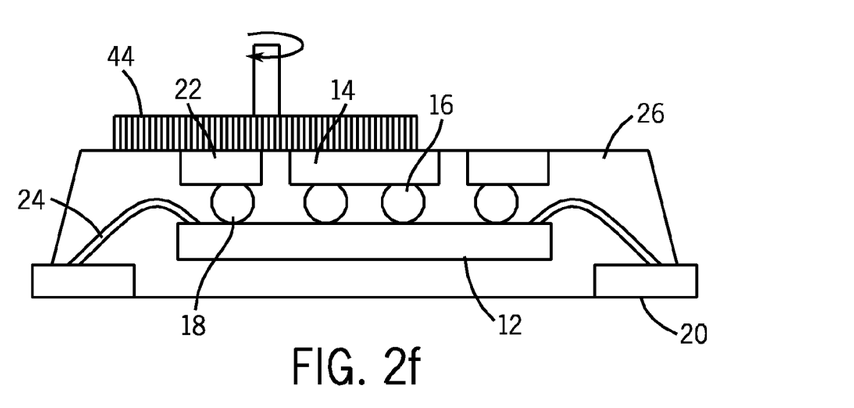
FIG. 2f illustrates a sixth step in a first example method of manufacturing a semiconductor package for a stacked-die arrangement.
Figure 2G:
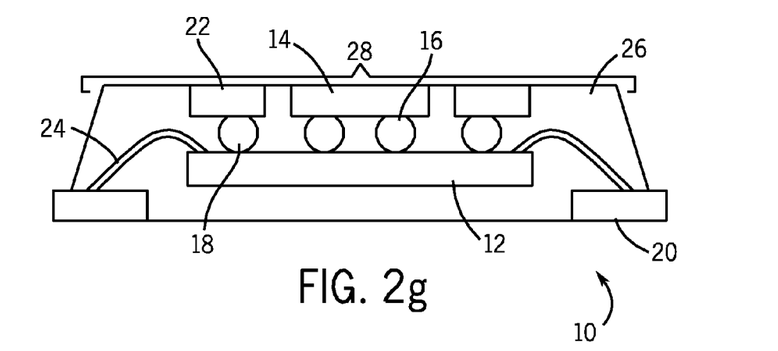
FIG. 2g illustrates a seventh step in a first example method of manufacturing a semiconductor package for a stacked-die arrangement.

FIG. 2f depicts the removal of elevated die paddle 40 once the encapsulant is in place to provide replacement structural support to dies 12,14. To remove the elevated die paddle 40 and separate the upper leads 22, a grind wheel 44 is used. A grinding process to remove elevated die paddle 40 can be various methods generally known in the art, including wheel grinding, chemical etching, or Chemical Mechanical Polishing (CMP) methods. The resulting package 10 in FIG. 2g shows an exposed surface 28 where an upper surface of upper leads 22, as well as die 14, is exposed to allow for further assembly of additional packages or other components.

Figure 3A:
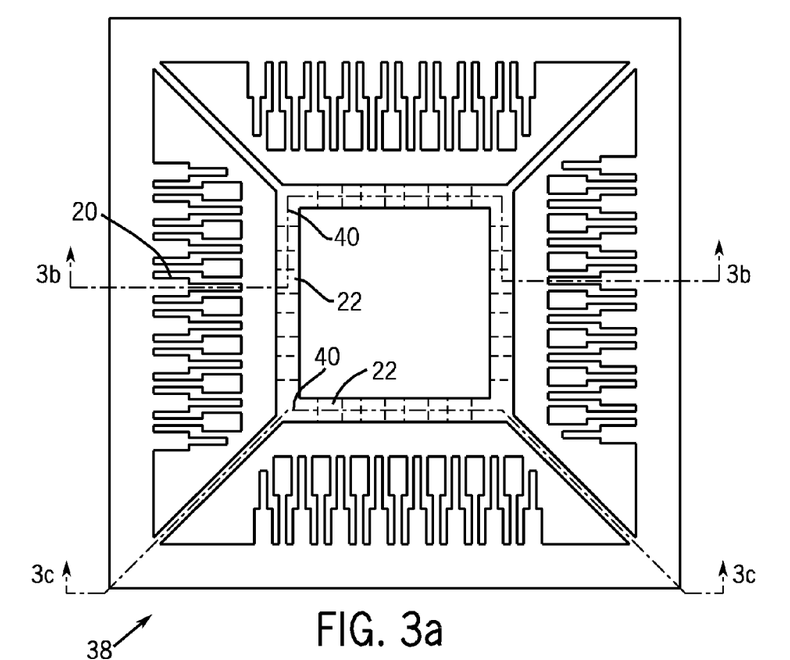
FIG. 3a illustrates a top view of a portion of a leadframe structure in an additional example embodiment.
Figure 3B:
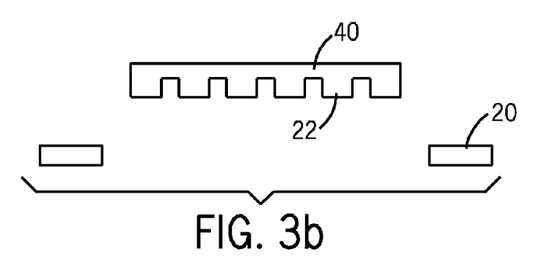
Figure 3C:
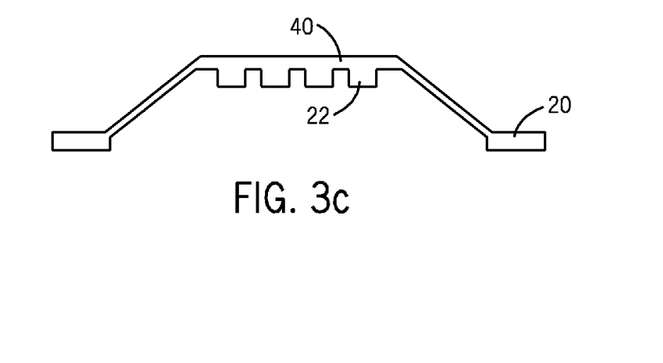

Turning to FIG. 3a, a top view of a portion of a leadframe structure 38 is depicted in an example embodiment in accordance with FIG. 2a. Leadframe 38 shows cross section lines 3b, 3c as depicted. Elevated die paddle 40 is connected to upper leads 22. Lower leads 20 are shown. FIG. 3b illustrates a first cross-sectional view of the leadframe 38 structure depicted in FIG. 3a taken along dotted line 3b. Again, elevated die paddle 40 is connected to upper leads 22. Lower leads 20 are depicted. FIG. 3c illustrates a second cross-sectional view of the leadframe structure depicted in FIG. 3a taken along dotted line 3c. Elevated die paddle 40, upper leads 22, and lower leads 20 are shown, again in accordance with figures which have previously been described.

Figure 4A:
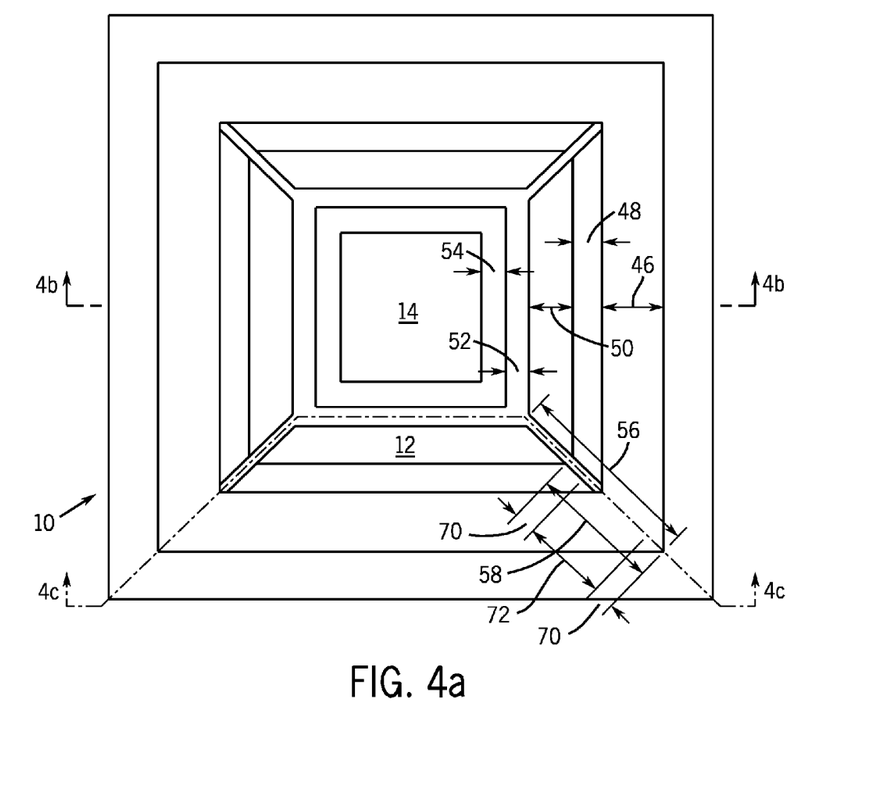
FIG. 4a illustrates various example dimensions of a top view of a stacked-die semiconductor package.

FIG. 4a illustrates various example dimensions of a top view of a stacked-die semiconductor package 10. Dies 12 and 14 are shown for purposes of reference. In one embodiment, a minimum package 10 size is recommended to be 7×7 millimeters (mm). Correspondingly, a maximum die size for die 14 is recommended to be 5.2×5.2 mm for a 9×9 mm package 10, and 3.2×3.2 mm for the minimum 7×7 mm package 10. In the embodiment shown in FIG. 4a, widths 46, 48, 50, 52, and 54 are 26 mils, 10 mils, 13, mils, 12 mils, and 15 mils, respectively, totaling 76 mils (1.93 mm) in width. Width 56 equals roughly the same width of 76 mils (1.93 mm). Width 58 is roughly 50 mils (1.27 mm). Width 70 is approximately 12 mills, which is the allowance from the die and leadframe edge to the start of upset bending. Finally, width 72 is approximately 26 mils (0.66 mm).

Figure 4B:
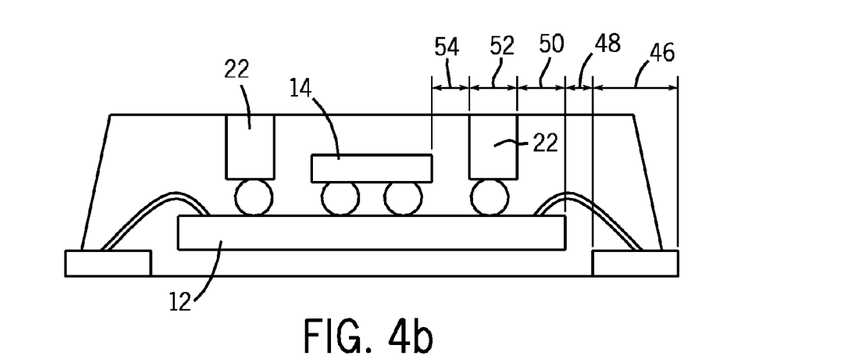
FIG. 4b illustrates various example dimensions of a first cross-sectional view of a stacked-die semiconductor package.

FIG. 4b illustrates various example dimensions of a first cross-sectional view of the stacked-die semiconductor package 10 depicted in FIG. 4a taken along dotted line 4b. Again, widths 46, 48, 50, 52, and 54 are seen, corresponding to widths 46, 48, 50, 52, and 54 depicted in FIG. 4a.

Figure 4C:
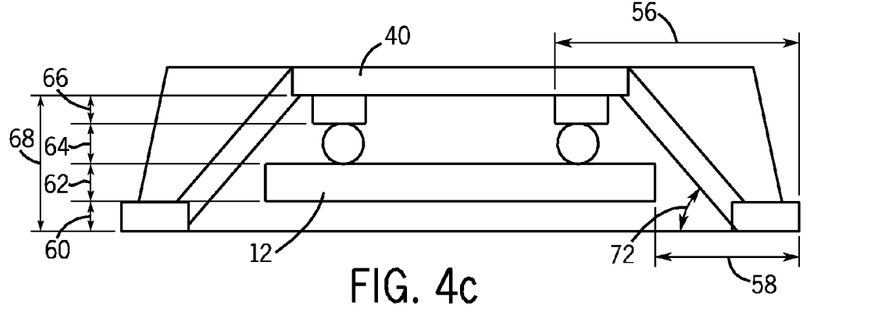
FIG. 4c illustrates various example dimensions of a second cross-sectional view of a stacked-die semiconductor package.

FIG. 4c illustrates various example dimensions of a second cross-sectional view of the stacked-die semiconductor package 10 depicted in FIG. 4a taken along dotted line 4c. Here, width 56, corresponding to approximately 76 mils (1.93 mm) is again depicted, as well as width 58, again corresponding to 50 mils (1.27 mm). A height 68 taken from a bottom surface of package 10 to a bottom surface of elevated die paddle 40 is approximately 26 mils (0.66 mm), which demonstrates a small height footprint. In the embodiment shown, elevated die paddle 40 makes an angle 72 of 45 degrees from horizontal.

Again, referring to FIG. 4c, heights 60, 62, 64, and 66 are approximately 6 mils, 8 mils, 4 mils, and 8 mils for a total height 68 of 24 mils (again 0.66 mm). Package 10, as a result, can achieve an extremely small height footprint. The ability of die 14 to rest inside upper leads 40 serves to decrease the overall height footprint of package 10.

Figure 5:
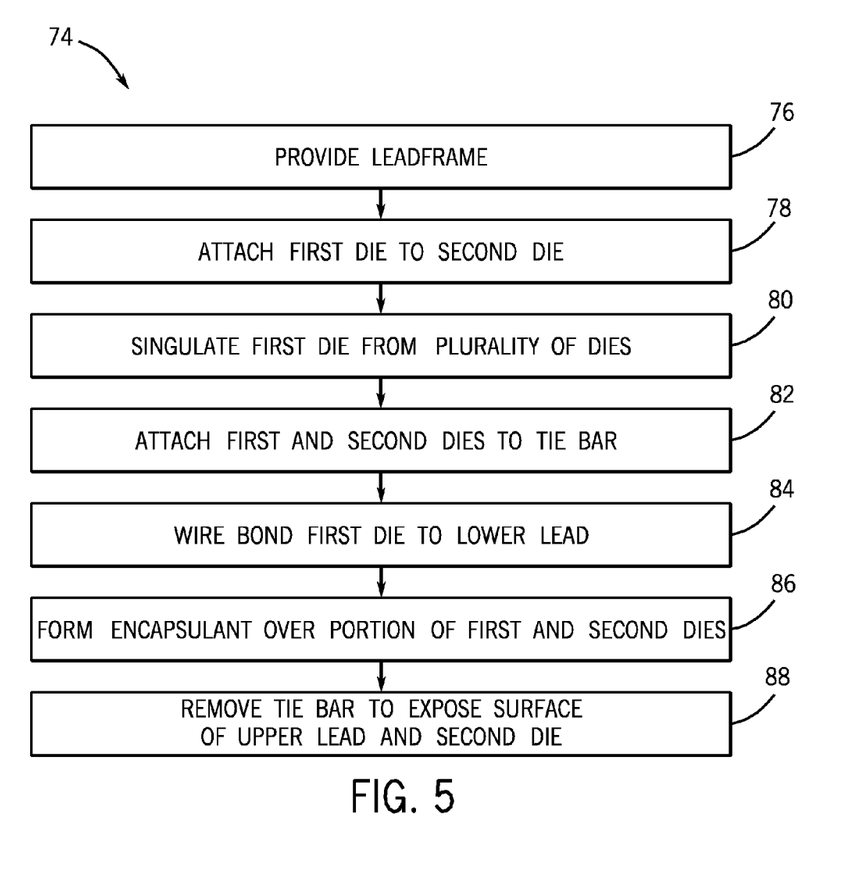
FIG. 5 illustrates an example method of assembling a stacked-die package in flow chart form.

FIG. 5 illustrates an example method 74 of assembling a stacked-die package 10 in flowchart form. A leadframe is provided (step 76). A first die is attached to a second die (step 78). Next, the first die is singulated from a plurality of dies (step 80). The first and second dies are attached to a elevated die paddle (step 82). The first die is wire bonded to a lower lead (step 84). An encapsulant is formed over a portion of the first and second dies (step 86). Finally, the elevated die paddle is removed to expose a surface of the upper lead and second die (step 88).

The use of package 10 involves new stacking concepts suitable for a leadframe package. As the cost of leaded packages is much lower than the costs associated with an array package, the use of package 10 is less expensive, yet the needs for higher functionality and device density of new generation packages are not compromised.

While one or more embodiments of the present invention have been illustrated in detail, the skilled artisan will appreciate that modifications and adaptations to those embodiments may be made without departing from the scope of the present invention as set forth in the following claims.

What is claimed is:

1. A semiconductor package comprising:
 a leadframe;
 an upper lead disposed above the leadframe;
 a first die attached to a lower surface of the upper lead to provide electrical conductivity from the first die to the upper lead;
 a second die attached to the first die; and
 a removable elevated die paddle disposed above the upper lead and second die to temporarily support the first and second dies within the semiconductor package during manufacturing.

2. The semiconductor package of claim 1, wherein the removable elevated die paddle is removed using a grind wheel.

3. The semiconductor package of claim 1, wherein a surface of the upper lead is adapted to provide electrical conductivity to a second semiconductor package configured in a package-on-package (PoP) arrangement.

4. The semiconductor package of claim 3, wherein the second semiconductor package further comprises a leaded package, array package, flip chip die, or a passive component.

5. A semiconductor package comprising:
 a leadframe;
 an upper lead and elevated die paddle assembly disposed above the leadframe, wherein a portion of the upper lead and elevated die paddle assembly is removed to provide electrical conductivity to a second semiconductor package;
 a first die connected a lower surface of the upper lead and elevated die paddle assembly to support the first die within the semiconductor package;
 a second die connected to the first die; and an encapsulant formed over a portion of the second die and upper lead for providing structural support to the first and second die within the semiconductor package.

6. The semiconductor package of claim 5, wherein the second die further includes a land grid array (LGA) or Quad Flat Nonleaded (QFN) package.

7. The semiconductor package of claim 5, wherein the second semiconductor package is adapted for a package-on-package (PoP) arrangement.

8. The semiconductor package of claim 7, wherein the second semiconductor package further comprises a leaded package, array package, flip chip die, or a passive component.

9. A method of manufacturing a semiconductor package comprising:
   providing a leadframe having an upper lead, a lower lead, and a elevated die paddle;
   attaching a first die to a second die, the first die attached to a plurality of dies in a wafer form;
   singulating the first die from the plurality of dies; and
   attaching the first and second dies to the elevated die paddle structure;
   wire bonding the first die to the lower lead;
   forming an encapsulant over a portion of the first and second dies; and
   removing the elevated die paddle to expose a surface of the upper lead and second die.

10. The method of manufacturing of claim 9, wherein removing the elevated die paddle is performed using a grinding process.

11. The method of manufacturing of claim 10, wherein the grinding process further includes wheel grinding, chemical etching or a chemical mechanical polishing (CMP) process.

12. The method of manufacturing of claim 9, wherein the first die is attached to the second die using a ball grid array (BGA).

13. The method of manufacturing of claim 9, wherein a surface of the upper lead is adapted to provide electrical conductivity to a second semiconductor package configured in a package-on-package (PoP) arrangement.

14. The method of manufacturing of claim 13, wherein the second semiconductor package further comprises a leaded package, array package, flip chip die, or a passive component.

* * * * *